United States Patent [19]

Laskaris et al.

[11] Patent Number: 4,660,013
[45] Date of Patent: Apr. 21, 1987

[54] COMPACT WHOLE BODY RESISTIVE MAGNETIC RESONANCE IMAGING MAGNET

[75] Inventors: Evangelos T. Laskaris, Schenectady; Madabushi V. Chari, Burnt Hills, both of N.Y.

[73] Assignee: General Electric Company, Schenectady, N.Y.

[21] Appl. No.: 779,366

[22] Filed: Sep. 23, 1985

[51] Int. Cl.[4] .............................................. H01F 5/00
[52] U.S. Cl. .................................. 335/299; 335/301; 324/318
[58] Field of Search .................. 335/799, 300, 301; 324/318, 319, 320, 321

[56] References Cited

U.S. PATENT DOCUMENTS 4,506,247 3/1985 Vermilyea ............... 335/299 X
4,574,261 3/1986 Cochran ..................... 335/299
4,584,548 4/1986 Inoue et al. ................. 324/320 X Primary Examiner—George Harris
Attorney, Agent, or Firm—William H. Steinberg; James C. Davis, Jr.; Paul R. Webb, II

[57] ABSTRACT

A resistive magnet is provided having a cylindrical radio frequency/gradient coil assembly. A first and second cylindrically shaped main coil is situated coaxially on either side of the radio frequency/gradient coil assembly with the radio frequency/gradient coil assembly and the first and second main coils having the same inside diameter defining a magnet bore. A cylindrical correction assembly coil surrounds the radio frequency/gradient coil assembly. Means for securing the first and second main coil to the cylindrical correction assembly is provided. The radio frequency/gradient assembly provides axial support for the first and second main coil assembly. For additional cylindrical main coils surround the correction coil.

16 Claims, 8 Drawing Figures

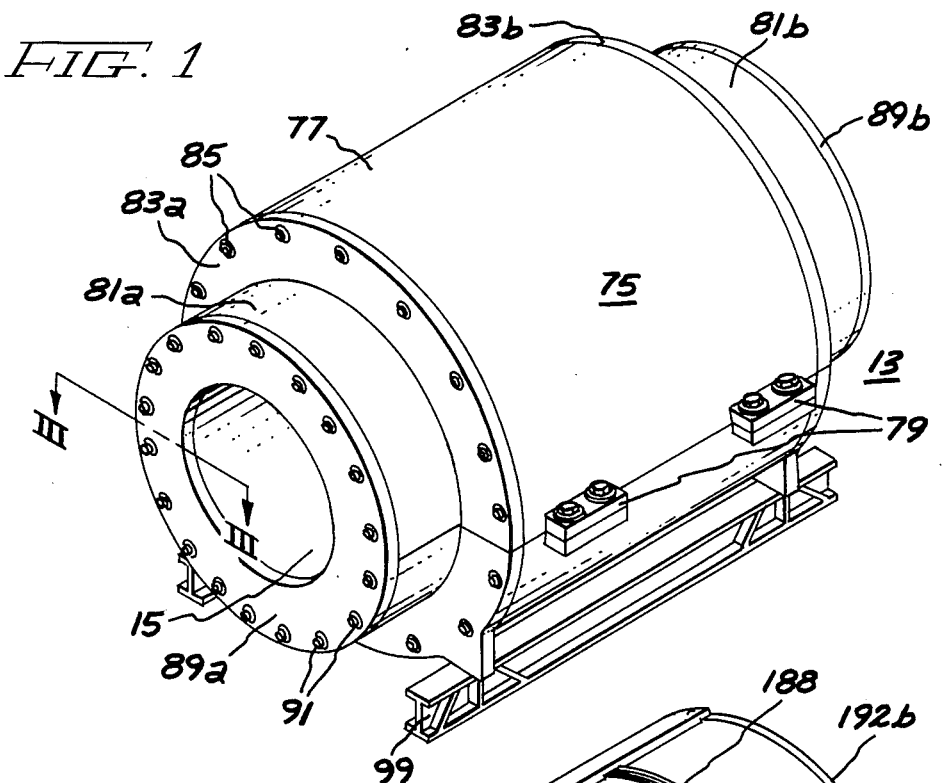
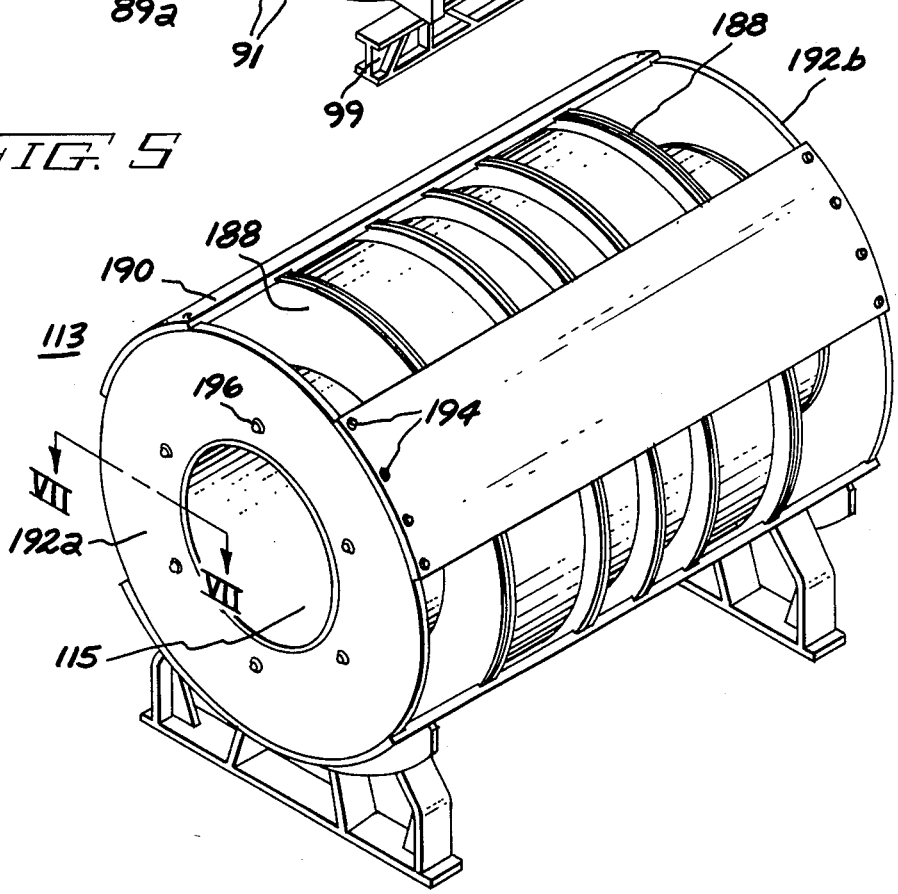

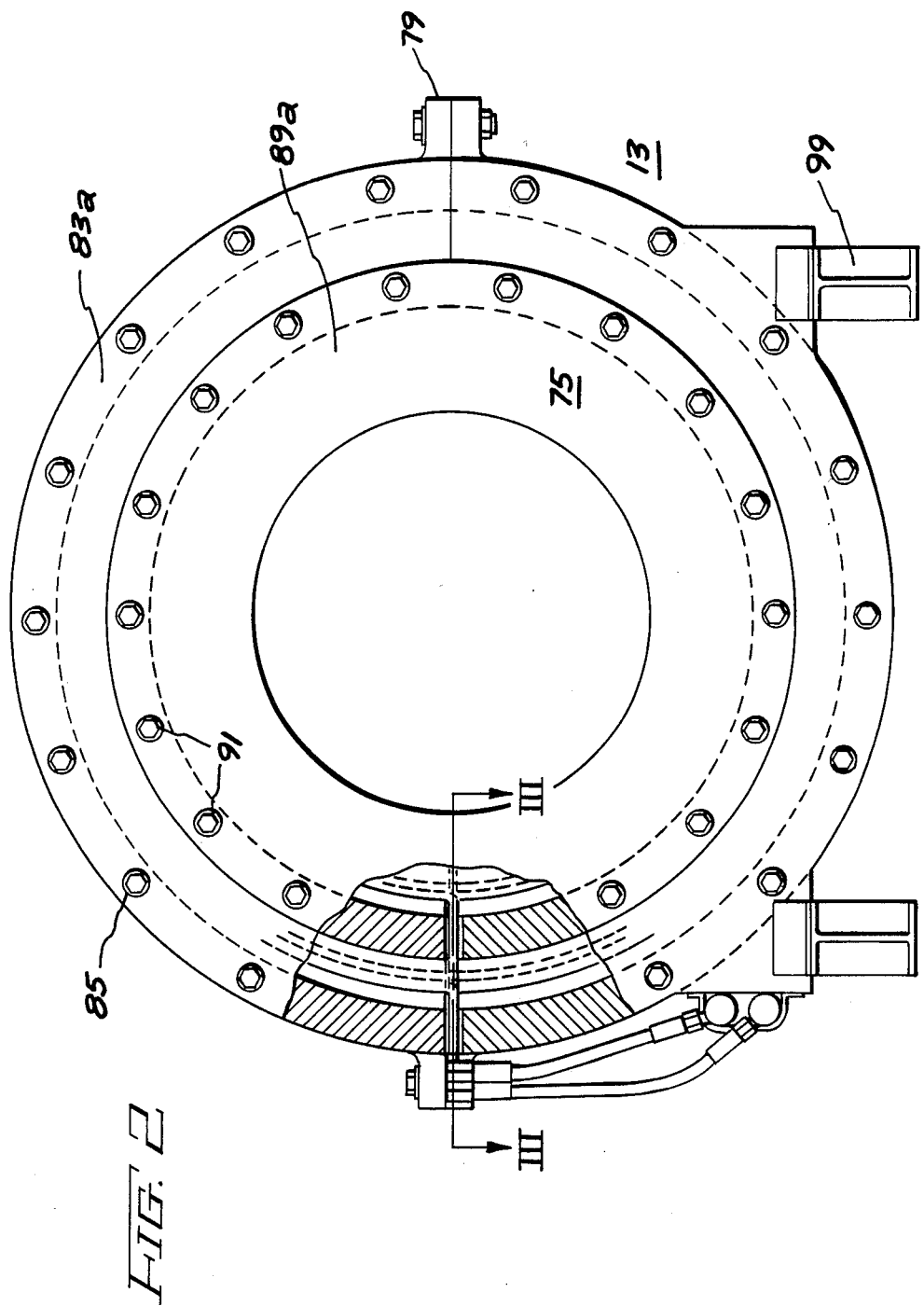

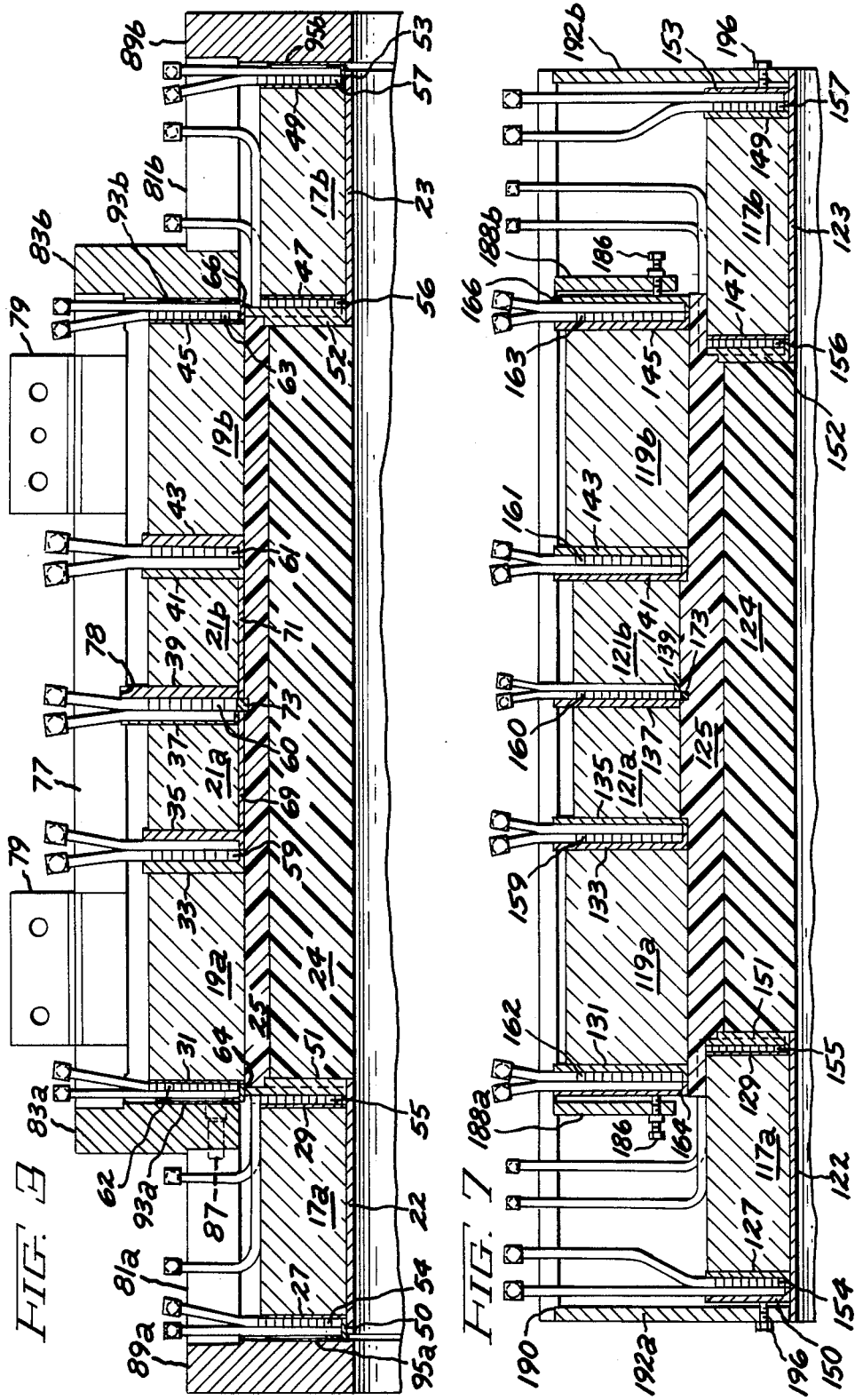

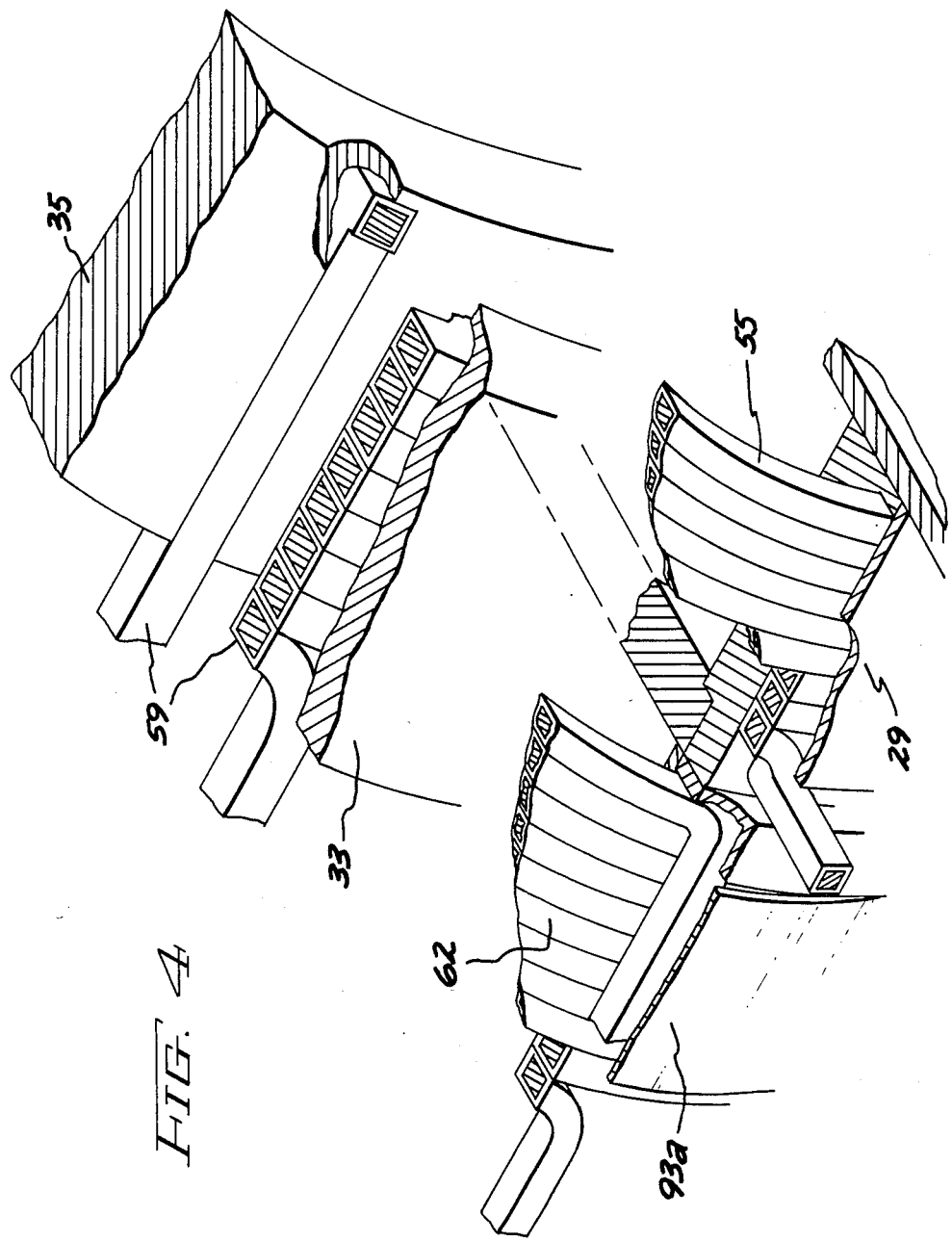

WATER TEMPERATURE CONTROL

COMPACT WHOLE BODY RESISTIVE MAGNETIC RESONANCE IMAGING MAGNET

BACKGROUND OF THE INVENTION

The present invention relates to a compact resistive magnet useful for whole body magnetic resonance studies such as imaging.

The use of electrically excited resistive magnets for magnetic resonance imaging has the advantages of low cost, smaller dimensions and ease of manufacture when compared to superconducting magnets which require the use of a cryogen and superconducting wire. However, resistive magnets are low field strength devices which have to be continuously energized from an external power source during operation and require external cooling to remove the large quantities of heat during operation.

Electrically excited resistive magnets for whole body magnetic resonance imaging become unattractive at field strengths of 0.3–0.4 Tesla and clear bores of 0.8–1.0 meters diameter because of excessive total weight and power consumption, with the power consumption increasing as the square of the required magnetic field strength. A clear bore diameter greater than 0.8 meters is typically required to slide a radio frequency/gradient coil assembly into the magnet bore during assembly.

It is an object of the present invention to provide a 0.3–0.4 Tesla whole body magnetic resonance resistive magnet with reduced magnet weight and power consumption.

It is a further object of the present invention to provide a 0.3–0.4 Tesla whole body magnetic resonance resistive magnet using 50–100 kw and weighing less than 7 tons overall weight.

SUMMARY OF THE INVENTION

In one aspect of the present invention a resistive magnet is provided having a cylindrical radio frequency/gradient coil assembly. A first and second cylindrically shaped main coil is situated coaxially on either side of the radio frequency/gradient coil assembly with the radio frequency/gradient coil assembly and the first and second main coils having the same inside diameter defining a magnet bore. A cylindrical correction coil assembly surrounds the radio frequency/gradient coil assembly. Means for securing the first and second main coil to the cylindrical correction assembly is provided. The radio frequency/gradient coil assembly provides axial support for the first and second main coil assembly. A third cylindrical main coil surrounds the correction coil.

BRIEF DESCRIPTION OF THE DRAWING

While the specification concludes with claims particularly pointing out and distinctly claiming the present invention, objects and advantages of the invention can be more readily ascertained from the following description of the preferred embodiments when used in conjunction with the accompanying drawing in which:

FIG. 1 is an isometric view of an electrically excited iron yoke resistive magnet in accordance with the present invention.

FIG. 2 is an end view of the magnet of FIG. 1;

FIG. 3 is a partial sectional view along the lines III—III of FIG. 1;

FIG. 4 is a partially exploded view of FIG. 3 showing spiral cooling tubes surrounded by disk shaped pads used for edge cooling of the magnet coils;

FIG. 5 is an isometric view of an electrically excited air core magnetic resonance magnet in accordance with the present invention;

FIG. 7 is a partial sectional side view along the lines V1—V1 of FIG. 5; and

DETAILED DESCRIPTION OF THE INVENTION

Figure 6:
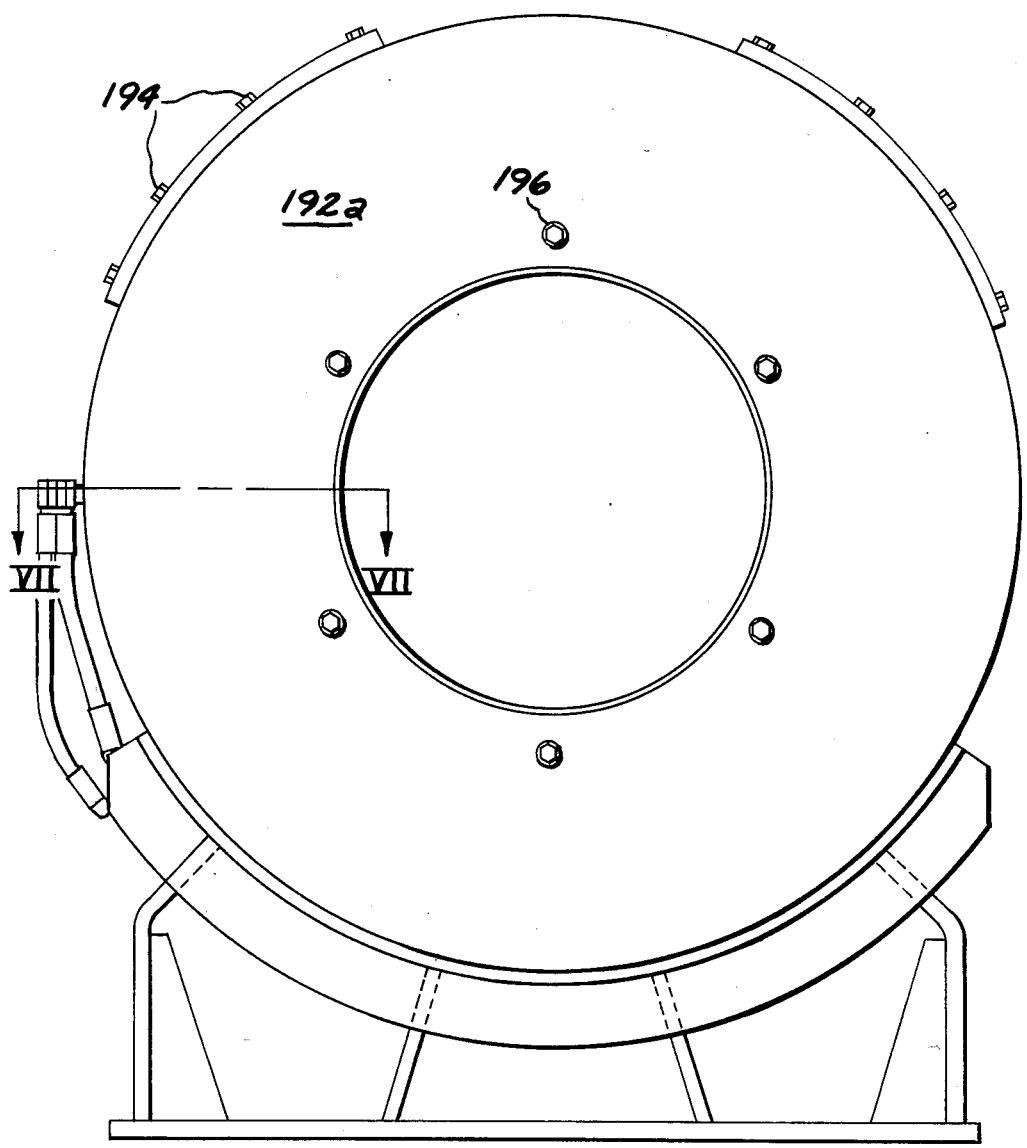
FIG. 6 is an end view of FIG. 5.

Referring now to the drawing wherein like reference numerals indicate like elements throughout and particularly to FIGS. 1 and 2 thereof, a cylindrical iron yoke magnetic resonance magnet 13 having a longitudinally extending bore 15 to allow for patient access is shown. Referring now to FIG. 3 a partial sectional view of the magnet is shown. The magnet 13 in the preferred embodiment relies on electrical current in six main coils to provide a constant field in the bore of the magnet. Two of the six main coils are cylindrically shaped outboard coils 17a and 17b, respectively, and the remaining four coils are cylindrically shaped inboard coils 19a, 19b, 21a and 21b. The two outboard coils 17a and 17b are each wound using a continuous sheet of copper on nonmagnetic bobbins 22 and 23, which can comprise cylindrical aluminum shells. The continuous copper sheet can be insulated prior to winding by wrapping the copper sheet with Mylar or Kapton insulating tape. Alternatively, the continuous copper sheet can be insulated by a coating of Formvar insulating material. The two outboard coils are arranged symmetrically on either side of a radio frequency/gradient coil assembly 24 and coaxially therewith. The radio frequency/gradient coil assembly is enclosed in a fiberglass shell. Since the two outboard coils 17a and 17b have an inside diameter of approximately the bore diameter the weight of the outboard coils are substantially reduced.

The radio frequency/gradient coil assembly 24 in operation generates a radio frequency magnetic induction field transverse to the field generated by the six main coils. The radio frequency field provides the excitation of the magnetization produced by the six main coils. The radio frequency coil also receives the resulting free inductive decay signals needed in magnetic resonance imaging. The gradient coil portion of the assembly produces spatial linear field gradients which are used in selective excitation to select a region for imaging and also to encode the location of MR signals received from the object being measured. The radio frequency/gradient coil assembly comprises a cylindrical fiberglass shell which has saddle shaped radio frequency coils situated therein. The saddle shaped radio frequency coils are surrounded by gradient field coils all enclosed in a fiberglass shell. The outboard coils and radio frequency coil assembly have the same clear bore diameter.

Correction coil assembly 25, which improve the uniformity of the field inside the magnet bore provided by the six main coils, surrounds the radio frequency/gradient coil assembly 24. The correction coil assembly comprises correction coils embedded in fiberglass. The correction coil assembly provides axial support for the two outboard coils 17a and 17b. The four inboard coil assembly 19a, 19b, 21a and 21b are wound directly around the correction coils using a continuous sheet of copper. The copper sheet can be insulated as previously described in connection with the outboard coils 17a and 17b. The six main coils are electrically connected in series with one another.

Adjacent to each edge of the six main coils is a disk shaped pad of high thermal conductivity nonmagnetic material 27, 29, 31, 33, 35, 37, 39, 41, 43, 45, 47 and 49, which in the preferred embodiment is aluminum. Pairs of disk shaped pads 50 and 27, 29 and 51, 64 and 31, 33 and 35, 37 and 39, 41 and 43, 45 and 66, 52 and 47, and 49 and 53, each defines a circular, centrally positioned circular aperture for cooling coils 54, 55, 62, 59, 60, 61, 63, 56 and 57, respectively, situated in the aperture. Cooling coils comprise a flat spiral of preferably rectangular tubing forming cooling coils 54, 55, 56 and 57, respectively. The rectangular tubing is fabricated from nonmagnetic high thermal conductivity material such as aluminum, copper or stainless steel. As can be seen in FIG. 4, the tubing in the outer diameter of the spiral extends radially to the exterior of the magnet. The tubing at the inner diameter of the spiral extends through a channel in the aluminum pad radially to the exterior of the magnet allowing each cooling tube spiral to be supplied with a constant input temperature cooling fluid. Water of constant inlet temperature is a suitable coolant. Saturated liquid Freon supplied from a constant pressure container can also be used as a constant temperature coolant. The return vapor can be condensed with a water, or air-cooled condensor.

To achieve a uniform magnetic field in the interior of the magnet, inboard coil 21a and 21b are wound on nonmagnetic cylindrical spacers 69 and 71, respectively, fabricated from nonmagnetic material such as aluminum. A split key 73 separates spacers 69 and 71 and is situated in a circumferential groove in the correction coils. The split key fixes the position of the inboard coils relative to the correction coils. Referring again to FIG. 1, an iron yoke 75 surrounds the magnet coils leaving apertures at either longitudinal end for access to the magnet bore. The iron yoke comprises a split cylindrical shell 77 joined together by plates 79. Shell 77 defines a circumferential groove 78 on the interior surface of the shell. The radial ends of aluminum pads 37 and 39 extend into the groove 78. Shell 77 surrounds the inboard coils 19a, 19b, 21a and 21b. A pair of split cylindrical shells 81a and 81b having smaller diameters than shell 77 surround the outboard coils 17a and 17b, respectively. Shells 81a and 81b are situated symmetrically on either side of shell 77 and coaxially therewith. A pair of split end rings 83a and 83b are secured to shell 77 by circumferentially spaced longitudinally extending bolts 85. A central aperture in end rings 83a and 83b and the inside diameter of cylindrical shells 81a and 81b are the same. Bolts 87 extend longitudinally through recessed apertures in the end rings 83a and 83b into the cylindrical shells 81a and 81b, respectively. End rings 89a and 89b define a central aperture coaxial with the bore of coil 17a and 17b and the bore of cylindrical shells 22 and 23. End rings 89a and 89b are secured to cylindrical shells 81a and 81b, respectively, by circumferentially spaced bolts 91 which extend longitudinally through end rings 89a and 89b, respectively. To obtain the highest field enhancement possible with the iron yoke, end rings 89a and 89b must have the minimum diameter available, that of the clear bore.

Split end rings 83a and 83b when secured by bolts 85, provide axial compressive forces through disk shaped ripple springs 93a and 93b which assure good contact between pads 31, 33, 35, 37, 39, 41, 43 and 45 and the edges of the inboard coils. End rings 89a and 89b are secured to cylindrical shells by circumferentially arranged bolts 91, which extend longitudinally through end rings 89a and 89b into shells 81a and 81b, respectively. Disc shaped ripple springs 95a and 95b situated between end ring 89a and cooling coil support 50 and end ring 89b and cooling pad support 53, respectively. Ripple springs 95a and 95b provide axial compression of outboard coils 17a and 17b against pads 27 and 29, and 47 and 49 assuring good heat conduction from the coil edges to the pads and then to the cooling coils. A thermally conductive grease can be used between the interface of the coil edges and pads to further improve heat transfer.

Referring now to FIG. 2, a gap in one side of the cylindrical shells 77, 81a and 81b that make up the iron yoke 75, permit each of the cooling coils to be connected to a constant temperature source of cooling liquid source and to return the liquid to the source. The iron yoke is supported on a cradle 99 which spreads the weight of the magnet and yoke assembly.

Referring now to FIG. 3 the iron yoke magnet is fabricated by joining the perimeter of the central aperture of the disk shaped cooling coil support 51 to the exterior portion at one end of aluminum bobbin 22 such as by welding. Similarly, disk shaped cooling coil support 52 is joined to the exterior portion of one end of bobbin 23. The radio frequency gradient coil assembly 24 is placed concentrically inside the correction coil 25. Disc shaped cooling coil supports 51 and 52 are circumferentially joined to correction coil assembly 25 using bolts (not shown) extending through the coil supports into the correction coil assembly. Split key 73 is placed in a circumferential groove 78 in the correction coil. Nonmagnetic cylindrical spacers 69 and 71 surround the correction coil assembly and are situated on either side of the split key 73. Cylindrical pads 37 and 39 are placed on either side of the split key 73 and includes spiral cooling coil 60 on the cylindrical spacers. Pads 35 and 41 surround the correction coil assembly and are situated adjacent to spacers 69 and 71, respectively. Pads 33 surrounds correction coil assembly 25 and together with pad 35 encloses cooling coil 59. Pad 43 surrounds correction coil 73 and encloses cooling coil 61. The inboard coils 19a and 19b are wound directly on the correction coil assembly. Outboard coil 17a and 17b are wound on bobbins 22 and 23. Inboard coils 21a and 21b are wound on spacers 69 and 71 which surround the correction coil assembly 25. Pad 31 and 45 are placed adjacent the ends of inboard coil 19a and 19b, respectively. Cooling coil support 64 encloses cooling coil 62 and is situated adjacent coil 19a. Similarly, cooling coil support 66 encloses a cooling coil 63 and is situated adjacent the end of inboard main coil 19b.

Pad 27 and pad 49 are situated adjacent outboard coil 17a and 17b, respectively. Cooling coil support 50 and 57 containing cooling coils 54 and 57, respectively, are situated adjacent pads 27 and 49, respectively.

Pads 37 and 39 extend further in the radial direction than do the other pads. Pads 37 and 39 fit in circular groove 78 in the interior of shell 77. The halves of shell 77 surround the inboard coils and are joined together by plates 79 welded to the edges of the shell halves. Ripple springs 93a and 93b are situated adjacent cooling coil support 64 and 66, respectively. Split end rings 83a and 83b are bolted to shell 77 by bolts 85 and serve to compress the ripple springs. Split cylindrical shells 81a is fastened to shell 83 by longitudinally extending bolts. Similarly, split cylindrical shell 81b is fastened to shell 83b by longitudinally extending bolts. Shells 81a and 81b are symmetrically placed on either side of shell 77 surrounding the outboard coils. Longitudinally extending bolts 87 secure shells 81a and 81b to split end rings 83a and 83b, respectively. Ripple springs 95a and 95b are situated adjacent to coil supports 50 and 53 and are compressed by end rings 89a and 89b. End rings 89a and 89b are held in place by longitudinally extending bolts 91 which hold the end rings to cylindrical shells 81a and 81b.

Referring now to FIGS. 5 and 6 an air core resistive magnet embodiment having a longitudinally extending bore 115 to allow patient access is shown. Referring now to FIG. 7 a partial cross sectional view of the magnet is shown. The magnet 113 in the preferred embodiment relies on electrical current in six main coils to provide a constant field to the bore of the magnet. Two of the six main coils 117a and 117b, respectively, are cylindrically shaped outboard coils and the remaining four coils are cylindrically shaped inboard coils 119a, 119b, 121a and 121b, respectively. The two outboard coils 117a and 117b are each wound as in the iron yoke embodiment on cylindrical nonmagnetic bobbins 122 and 123 using a continuous sheet of copper, which can be insulated as previously described. The two outboard coils are arranged symmetrically on either side of a radio frequency/gradient coil assembly 124 and coaxially therewith providing smaller diameter coils which reduce weight. Each of the four inboard coils are wound directly on the correction coil assembly 125 using a continuous sheet of copper, insulated as described in connection with the outboard coils.

Adjacent to each edge of the six main coils is a disk shaped pad of high thermal conductivity nonmagnetic material 127, 129, 131, 133, 135, 137, 139, 143, 145, 147 and 149 which in the preferred embodiment is aluminum. Pairs of disk shaped pads 150 and 127, 129 and 151, 164 and 131, 133 and 135, 137 and 139, 141 and 143, 145 and 166, 152 and 143 and 149 and 153 each define a central circular aperture for cooling each 154, 155, 162, 159, 160, 161, 163, 156 and 157, respectively, situated in the aperture. Cooling coils comprise a flat spiral of the type used in the iron yoke magnet. The tubing at the inner diameter of the spiral cooling coil extends through a channel in the aluminum pad radially outward to the exterior of the magnet.

Disk shaped pads 151 and 152 are fastened to bobbins 122 and 123, respectively, by welding. Disk shaped pads 151 and 152 are also fastened to correction coil assembly 125 by bolts (not shown) extending through the disks into the correction coil assembly so that the correction coil assembly provides axial support to the outboard coils (17a and 17b).

Axial compression of the pads to the edges of the inboard coils is achieved by adjusting bolts 186, circumferentially spaced about a nonmagnetic disk 188a and 188b on either axial end of the inboard coils, respectively. Axial compression assures good thermal transfer and limits coil movement. The adjusting bolts 196 provides adjustable axial compression of the outboard coils. A thermally conductive grease can be used between the interface of the coil edges and pads to further improve heat transfer. The stepped exterior of the correction coils and the key 173 assures the positioning of the disk shaped pads 135, 141 and 137 thereby assuring the positioning of the inboard coils relative to the correction coils. The disk shaped aluminum pads 164, 131, 133, 135, 137, 139, 141, 143, 145 and 166 and 188b and the disks 188a and 188b are held in position by longitudinally extending arcuate segments 190 having transverse grooves into which the periphery of the cooling pads and disks 188 extend. The longitudinal ends of the arcuate segments are secured to end plates 192a and 192b by bolts 194 passing through the arcuate segments and extending radially into the end plates. The end plates 192a and 192b have a central aperture which fits about the end of bobbins 122 and 123. Circumferentially arranged bolts 196 extend longitudinal through end plates 192a and 192b and exert axial compressive forces on the outboard coils by exerting axial force against pads 127 and 149. Axial compression of the inboard and outboard coils assures good thermal contact between the pads and the coil edges and restricts coil movement during magnet operation.

Figure 8:
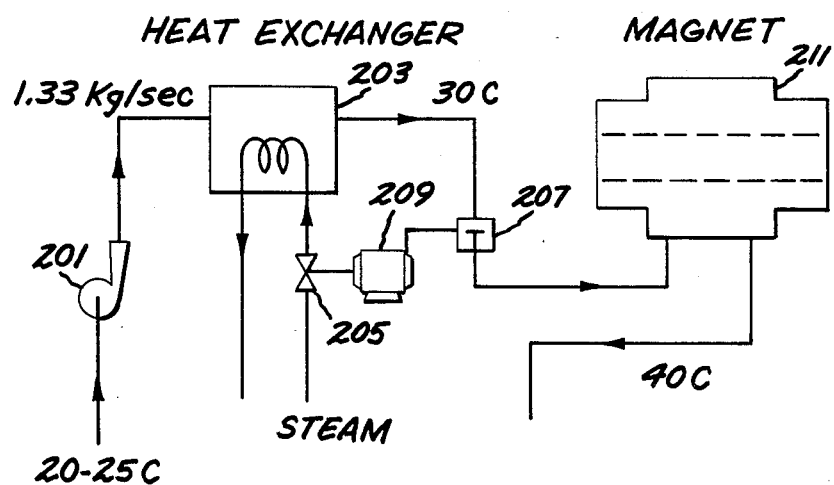
FIG. 8 is a schematic representation of a water cooling control system suitable for use with the resistive magnets of the present invention.

Water of constant inlet temperature can be obtained from a control system of the type shown in FIG. 8. The correction coils and the inboard main coils of the resistive magnet of the present invention share the same cooling system. A source of water at 20°–25° C. is pumped by pump 201 to a heat exchanger where the outlet temperature is regulated to 30° C. by varying the amount of steam introduced to the heat exchanger using a feedback system. The feedback system controls the position of a valve 205 responsive to the heat exchange outlet temperature measured by sensor 207 which controls the valve 205 position by a motor 209. The 30° C. water is introduced to each of the spiral cooling coils of resistive magnet 211 and when discharged, is heated to approximately 40° C. A well regulated constant inlet temperature of cooling water to the magnet is important so as to ensure good dimensional and therefor good temporal stability of the field produced by the magnet.

While a six-coil main magnet design which comprises two outboard coils and four inboard coils has been shown. A three-, four-, or five-coil magnet design can have a similar configuration with the outboard coils arranged symmetrically on either side of the RF/gradient coil assembly and having the same clear bore diameter but less field uniformity.

The magnetic yoke embodiment shown in FIGS. 1, 2, 3, and 4 enhances the central field of the main coils, by as much as 25%. Consequently, a six-coil main coil design that produces 0.25 Tesla central field without an iron yoke can be boosted to about 0.30 Tesla when the yoke is added with no additional power consumption. The field enhancement results in a more cost effective magnet compared to an air-core magnet of the same field strength and power consumption, since iron is more than three times less expensive than copper. The iron core and air core magnets have a similar total weight with the iron core design using less copper. The magnetic yoke also serves as an integral magnetic shield. The highest possible bore field is obtained with minimum copper, iron weight and power loss only when the outboard coils and yoke end plates have the minimum inside diameter, that of the magnet clear bore.

Comparing an iron yoke design and air core design of the type shown in the drawing each having a field strength of 0.3 Tesla, a clear bore diameter of 60 cm. and six main coils, the iron yoke magnet has a total weight of 12,600 pounds comprising 7,000 pounds of copper and 5,600 pounds of iron. The air core magnet weighs 12,670 pounds. Each embodiment has a power loss of 56 kilowatts.

When a magnetic yoke is to be incorporated into the magnet design, the ampere turns and position of each coil must be optimized in the presence of a given yoke geometry to yield the highest possible field uniformity in the imaging volume of interest. Tables 1 and 2 below show the different coil dimensions for an iron core and an air core magnet of the type shown in FIGS. 3 and 7, respectively.

TABLE 1

IRON YOKE MAGNET

| Coil | 17a and 17b | 19a and 19b | 21a and 21b |
|---|---|---|---|
| Inside Radius | 30.53 cm. | 43.60 cm. | 43.74 |
| Outside Radius | 40.52 cm. | 53.59 cm. | 53.61 |
| Coil Width | 27.00 cm. | 27.00 cm. | 13.5 cm. |
| Distance From the Center of the Bore Axially to the Coil Centerline | 61.99 cm. | 59.14 cm. | 8.17 cm. |
| Copper Sheet Thickness | .040 in. | .040 in. | .080 in. |
| Number of Turns | 96 | 96 | 48 |
| Current | 827A | 827A | 827A |

TABLE 2

AIR CORE MAGNET

| Coil | 117a and 117b | 119a and 119b | 121a and 121b |
|---|---|---|---|
| Inside Radius | 30.88 cm. | 45.13 cm. | 45.94 cm. |
| Outside Radius | 42.65 cm. | 62.21 cm. | 60.96 cm. |
| Coil Width | 30.00 cm. | 30.00 cm. | 15.91 cm. |
| Distance From the Center of the Bore Axially to the Coil Centerline | 64.29 cm. | 23.18 cm. | 3.58 cm. |
| Number of Turns | 115 | 164 | 73 |
| Current | 685A | 685A | 685A |

The present invention by situating main coils at the minimum bore diameter of the magnet allows reduced magnet weight and power consumption and improved field uniformity. The two outboard coils and the correction coils create a cavity in which the radio frequency/gradient coil assembly is situated. The foregoing describes a resistive magnet suitable for use in whole body magnetic resonance studies having a strength of 0.3–0.4 Tesla and weighing less than 7 tons overall.

While the invention has been particularly shown and described with reference to several preferred embodiments thereof it will be understood by those skilled in the art that various changes in form and details may be made without departing from the spirit and scope of the invention.

What is claimed is:

1. A resistive magnet comprising:
   a cylindrical radio frequency/gradient coil assembly;
   a first and second cylindrically shaped main coil situated coaxially on either side of said radio frequency/gradient coil assembly, said first and second main coil and said radio frequency/gradient coil assembly all having the same inside diameter, defining a magnet bore;
   a cylindrical correction coil assembly surrounding said radio frequency/gradient coil assembly;
   means for securing said first and second cylindrically shaped main coil to said cylindrical correction coil assembly, said cylindrical coil assembly providing axial support for said first and second main coil; and
   a third cylindrical main coil surrounding said correction coil.

2. The resistive magnet of claim 1 further comprising a yoke of flux conducting material comprising a generally cylindrical shell surrounding said main coils and two end plates enclosing the end portions of said generally cylindrical shell, said end plates each defining a central aperture having the same diameter as the magnet bore and situated coaxially therewith.

3. The resistive magnet of claim 1 wherein each of said main coils comprise a continuous insulated sheet of conductive material forming a coil.

4. The resistive magnet of claim 1 wherein said means for securing said first and second cylindrically shaped main coil comprises disc shaped pads of heat conductive non-magnetic material surrounding a flat spiral of rectangular cooling coils, said disc shaped pads situated between the edges of said first and second main coil and said radio frequency/gradient coil, said disc shaped pads secured to one of said first and second main coils and said correction coil assembly.

5. The resistive magnet of claim 4 further comprising disc shaped pads of heat conductive non-magnetic material adjacent to the remaining edges of each main windings, said pads surrounding a flat spiral of rectangular cooling coils.

6. The resistive magnet of claim 1 wherein said first and second cylindrical main coils comprise coils wound directly on a nonconductive bobbin having the same inside diameter as said radio frequency/gradient coil assembly said means for securing said first and second main coil securing said bobbins on either side of said correction coil assembly.

7. A resistive magnet comprising:
   a cylindrical radio frequency/gradient coil assembly;
   a first and second cylindrically shaped outboard main coil comprising two nonmagnetic bobbins and a continuous insulated sheet of conductive material wound on each bobbin, said first and second outboard main coil situated coaxially on either side of said radio frequency/gradient coil assembly, said two bobbins and said radio frequency/gradient coil assembly having the same inside diameter defining a cylindrical magnet bore;
   a cylindrical correction coil assembly surrounding said radio frequency/gradient coil assembly;
   means for securing said two bobbins to said correction coil assembly, said correction coil assembly providing axial support for said two bobbins, and
   a plurality of inboard main coils comprising continuous insulated sheets of conductive material wound around said correction coil assembly.

8. The resistive magnet of claim 7 further comprising a yoke of flux conducting material including a generally cylindrical shell surrounding said inboard and outboard main coils and end plates enclosing the end portions of said generally cylindrical shell, said end plates each defining a central aperture having the same diameter as the magnet bore and situated coaxially therewith.

9. The resistive magnet of claim 7 wherein said means for securing said two bobbins comprises disc shaped pads of heat conductive non-magnetic material surrounding a flat spiral of rectangular cooling coils, and disc shaped pads situated between the edge of said bobbins and said radio frequency/gradient coil, said disc shaped pads secured to said bobbins and said correction coil assembly.

10. The resistive magnet of claim 9 further comprising disc shaped pads of heat conductive non-magnetic material adjacent to the remaining edges of each inboard and outboard main winding, said pads surrounding a flat spiral of rectangular cooling coil.

11. The resistive magnet of claim 10 further comprising means for axially compressing said inboard and outboard coils.

12. A resistive magnet comprising:
a cylindrical radio frequency/gradient coil assembly;
a first and second cylindrically shaped main coil situated coaxially on either side of said radio frequency/gradient coil assembly, said first and second main coil and said radio frequency/gradient coil assembly all having the same inside diameter, defining a magnet bore;
a cylindrical correction coil assembly surrounding said radio frequency/gradient coil assembly;
means for securing said first and second cylindrically shaped main coil to said cylindrical correction coil assembly, said cylindrical coil assembly providing axial support for said first and second main coil;
a third cylindrical main coil surrounding said correction coil; and
a yoke of flux conducting material comprising a generally cylindrical shell surrounding said main coils and two end plates enclosing the end portions of said generally cylindrical shell, said end plates each defining a central aperture having the same diameter as the magnet bore and situated coaxially therewith.

13. The resistive magnet of claim 12 wherein each of said main coils comprise a continuous insulated sheet of conductive material forming a coil.

14. The resistive magnet of claim 13 wherein said means for securing said first and second cylindrically shaped main coil comprises disc shaped pads of heat conductive non-magnetic material surrounding a flat spiral of rectangular cooling coils, said disc shaped pads situated between the edges of said first and second main coil and said radio frequency/gradient coil, said disc shaped pads secured to one of said first and second main coils and said correction coil assembly.

15. The resistive magnet of claim 14 further comprising disc shaped pads of heat conductive non-magnetic material adjacent to the remaining edges of each main winding, said pads surrounding a flat spiral of rectangular cooling coils.

16. The resistive magnet of claim 15 further comprises planar disk shaped ripple springs situated adjacent the outer disk shaped cooling pads of the first and second main coil and the third coil compressed by the end plates of yoke of flux conducting material, thereby providing axial compression between the edge of the windings and the disk shaped cooling pads.

* * * * *